United States Patent [19]

Sugimoto et al.

[11] Patent Number: 4,485,957
[45] Date of Patent: Dec. 4, 1984

[54] WIRE BONDER

[75] Inventors: Tatsuo Sugimoto, Fuchu; Seiji Shigyo, Hitachi; Kazutoshi Takashima, Higashiyamato; Yuichi Komaba, Kasukabe, all of Japan

[73] Assignees: Hitachi, Ltd.; Hitachi Ome Electronic Co., Ltd., both of Tokyo, Japan

[21] Appl. No.: 382,105

[22] Filed: May 26, 1982

[30] Foreign Application Priority Data

Jun. 22, 1981 [JP] Japan ................... 56-95351

[51] Int. Cl.³ .............................................. B23K 37/00
[52] U.S. Cl. ...................................... 228/4.5; 228/10
[58] Field of Search ........................... 228/10, 9, 4.5; 340/568; 200/61.18

[56] References Cited

U.S. PATENT DOCUMENTS 3,604,958  9/1971  Palini ................................... 340/568
4,213,556  7/1980  Persson et al. ...................... 228/104

FOREIGN PATENT DOCUMENTS 5651834  of 1979  Japan.
0023469  2/1979  Japan ................................... 228/4.5
0021134  2/1980  Japan ................................... 228/4.5

Primary Examiner—Nicholas P. Godici
Assistant Examiner—Kurt Rowan
Attorney, Agent, or Firm—Antonelli, Terry & Wands

[57] ABSTRACT

A wire bonder is frequently used for assembling the electronic parts of a semiconductor device or the like and exhibits an effect in the electric connections of the aforementioned electronic parts with a fine metal wire. The wire bonder according to the present invention comprises a clamper for clamping a bonding wire, and bonding wire disconnection detecting means for detecting the disconnection of the bonding wire in terms of the wire clamping state of the clamper. In order to detect highly accurately and reliably the disconnection of the bonding wire, the aforementioned bonding wire disconnection detecting means is characterized by the provision of a detecting unit for detecting a quantity which corresponds to the facing gap of the clamper during the clamping operation.

6 Claims, 17 Drawing Figures

FIG. 7
| INPUT | | OUTPUT |
|---|---|---|
| S | R | Q |
| H | H | $Q_0$ |
| L | H | H |
| H | L | L |
| L | L | H |
FIG. 8A
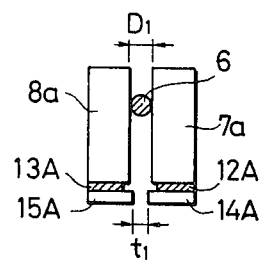
FIG. 8B
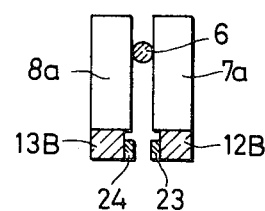
FIG. 8C
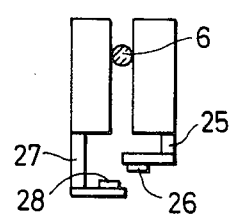
FIG. 9
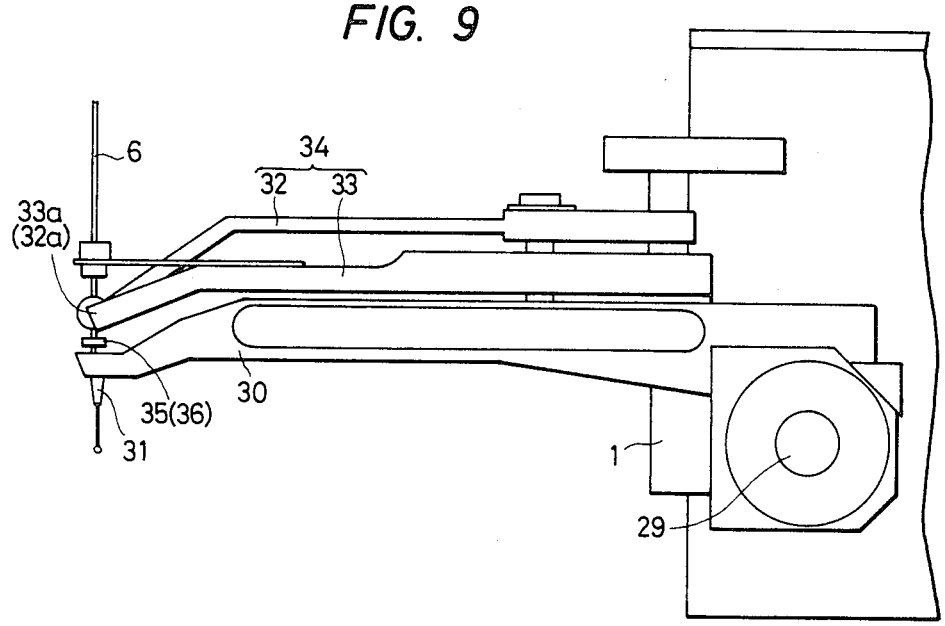

WIRE BONDER

BACKGROUND OF THE INVENTION

The present invention relates to a wire bonder.

In an existing wire bonder for assembling a semiconductor device, one worker usually takes care of one wire bonder and does his bonding work. As a result, the disconnection of a wire (i.e., a gold wire) can be confirmed, when it occurs, by the worker so that he can instantly stop the bonder to apply the wire to a predetermined position.

However, when the wire bonding operation is automated so that the worker takes care of several bonders, it is indispensable to automatically detect the disconnection of the wire, instantly when it takes place, so that the troubled bonder may be stopped.

When in the wire bonding oeration, care has to be taken for prevention of a variety of accidents such as pellet short-circuiting resulting from contact between the wire and a pellet, table short-circuiting resulting from contact between the wire and a table, or wire short-circuiting resulting from mutual contact between the wires. Moreover, even if the semiconductor device is operated so that it is heated or cooled, the wire has to be prevented from being disconnected.

It is, therefore, necessary to allow the wire (i.e., the gold wire), which is tensed between the semiconductor pellet and its lead, to draw a smooth curve. There has been provided according to the prior art means for drawing such curve, which is effected by bonding a first portion to be bonded, by subsequently letting off a wire having a larger length than a required one from a capillary while the capillary is being located around for a second bonding step, and by bonding a second portion to be bonded while slightly taking up again that wire upon its spool. In view of these circumstances, a torque is so imparted to the spool having the wire wound thereon as to allow the spool to rotate backward at all times, whereas a back tension is applied to the wire at all times.

Once the wire is cut, therefore, it is abruptly taken up by the action of the rotating torque of the spool. The wire is randomly wound, if it is taken up in that way, upon the spool, and its end portion is waved about to contact with the surrounding member or members so that it is damaged. The wire thus damaged is frequently entangled, cut or brought into a substantially cut state. This raises disadvantages that it takes a long time to prepare the bonding operation and that the semiconductor device fabricated is troubled while it is being used.

In order to eliminate these disadvantages concomitant with the prior art, there exists a wire bonder of thermo compression neil head wire bonding type, as is disclosed in Japanese patent publication No. 53-31713, in which whether or not the wire is disconnected is detected to control in case of the disconnection the torque applied to the spool so as to tense backward the wire.

FIG. 1A is a perspective view showing a major portion of the above-specified wire bonder according to the prior art. Reference numeral 101 indicates a hollow spool holder having an outer circumference, on which a spool 102 is rotatably fitted. The spool holder 101 is made of such a cylinder as is formed with a number of air-injecting through holes at a certain angle between the inside and outer circumference thereof. The openings of those injecting holes are so directed that the spool 102 is rotated in the opposite direction to the wire letting-off direction indicated at an arrow. As a result, if compressed air is supplied into the center bore of the spool holder 101, it is injected from those injecting holes thereby partly to bear the spool 102 with the air injected and partly to impart a backward torque to the spool 102.

In FIG. 1A: numerals 105, 106, 107, 108, 109, 110 and 111 indicate a clamper, a capillary, a wire disconnection detecting circuit, a timing pulse supply circuit, a flip-flop circuit, a valve actuator and an electromagnetic valve, respectively.

The detail of the clamper 105 is shown in FIG. 1B. On the inner sides of clamping arms 112 and 113, there are borne insulating members 114 and 115, one of which 114 is equipped with an electrode 116. The clamper 105 thus constructed is actuated by means of an electromagnet or a cam, when in the bonding operation, to clamp a wire W.

The aforementioned electrode 116 is used to contact with the wire W thereby to confirm the existence of it and is connected through a lead wire 117 with the wire disconnection detecting circuit 107.

Next, the operations of the system thus constructed will be described in the following. After a ball $W_1$ formed at the leading end of the wire W is forced to contact with the pad portion on a semiconductor pellet 119 secured to a table 118, the capillary 106 is moved in the direction of arrow A of FIG. 1A to force the wire W to contact with a lead 120 until the state of FIG. 1C is established. Then, the clamper 105 and the capillary 106 are elevated, as indicated at arrow B, to cut the wire W at a position close to the lead 120.

As shown in FIG. 1A, when the capillary 106 tenses the wire W from a first bonding portion (i.e., the pad portion on the pellet) to a second bonding portion (i.e., the lead), the clamper 105 is left open. Since, at this state, the voltage at a point D of the detecting circuit 107 is high, the transistor is rendered conducting so that the potential at a point C is at substantially the same level of 0 V as that of the earth terminal.

Next, when the lead 120 is to be bonded, as shown in FIG. 1C, the clamper 105 is closed, and the potential at the point D of the detecting circuit is grounded to the earth through the electrode 116, the wire W and the lead 120 so that it is reduced to 0 V so that the transistor is cut off. As a result, the potential at the point C becomes substantially equal to the voltage of the power source.

In case the wire W is cut between the semiconductor pellet 119 and the lead 120, as shown in FIG. 1D, the electrode 116 is not grounded so that the potential at the point D fails to take 0 V. As a result, the transistor is rendered conducting so that the potential at the point C is reduced to 0 V.

It is measured by the aforementioned method whether or not the wire W is disconnected. In this method, it is sufficient that the potential at the point C is measured when timing pulses for closing the clamper 105 are received during the bonding operation. In short, it is indicated that the wire W is not cut, if the potential at the point C is high, but is cut if that potential is low.

If the existence of the disconnection of the wire W is detected in the aforementioned manner by the use of the clamper 105, the flip-flop circuit 108 is set, when the pulses are supplied from the timing pulses supply circuit 108, and the valve actuator 110 is operated in response to the signal of the flip-flop circuit 109 to close the electromagnetic valve 111 thereby to interupt the supply of the compressed air, which has been continued to the holes of the spool holder 101 by way of a conduit 121 until that time.

As has been described hereinbefore, the wire bonder is so constructed to detect whether or not the wire is disconnected that the supply of the compressed air for reversing the spool is controlled by the detection signal. As a result, as soon as the disconnection takes place, the detecting unit operates to prevent the spool from rotating backward.

As a result, since the wire is not wound randomly upon the spool, the wire can be let off again in a smooth manner so that the trouble in the wire bonding operation such as the disconnection of the wire can be prevented.

However, the wire bonder thus far described according, to the prior art is equipped with the means for detecting the disconnection of the bonding wire. In spite of this equipment, that detecting means may fail to operate at a normal state so that the bonding wire itself of the wire bonder may be disconnected before it is bonded to a work such as the pellet or the lead. If the wire bonder is operated while having its bonding wire left disconnected, it frequently occurs that the bonding wire cannot be applied to the portion of the work to be bonded. This will be described in the following.

In the disconnection detecting means of that type according to the prior art, a clamper to clamp the bonding wire is made of a conductive material to provide conduction between the wire and the clamper during the clamping operation, and the clamper is connected with one electrode whereas the wire is connected with the other electrode at the side of the semiconductor pellet or the spool thereby to form the clamper and the bonding wire into a part of the predetermined detecting circuit. In the means having the construction thus far described, in the normal case in which the wire is not disconnected, the clamper clamps the wire to provide conduction inbetween. When the wire is disconnected, on the other hand, the clamper releases the wire and fails to clamp it any more so that the portion of the aforementioned detecting circuit is at its open state. As a result, it becomes possible to detect the disconnection of the wire in accordance with the conduction and inconduction between the clamper and the wire.

However, it has been found difficult for that means to accurately detect especially the disconnection of the wire bonder of ultrasonic type using an aluminum wire as the bonding wire. The intense investigation of the cause for that difficulty has revealed that, since the aluminum wire has its surface formed with alumina having bad electric conductivity, the clamper and the aluminum wire are insulated, even if this aluminum wire is normally clamped, by the alumina formed on the surface of that aluminum wire so that the detecting circuit is not closed to invite a malfunction in the detection. It is also found that in the case of such malfunction an automatic interruptor operates, in spite of the normal operation of the wire bonder, to invite an emergency stop of the wire bonder, and that this difficulty remarkably deteriorates the working efficiency.

SUMMARY OF THE INVENTION

It is, therefore, an object of the present invention to provide a novel wire bonder which is freed from any of the disadvantages of the prior art thus far described.

In order to achieve this object, according to the present invention, there is provided a wire bonder of the type, in which whether or not a bonding wire is detected by a clamper is detected in terms of the spaced distance between a pair of clamper tips or in terms of a distance associated therewith so that the disconnection of the wire can be stably detected at all times irrespective of the material of the wire thereby to improve the efficiency of the wire bonding operation.

The present invention can best be understood by reference to the following description taken in connection with the accompanying illustrative drawings.

BRIEF DESCRIPTION OF THE DRAWINGS

FIG. 1A is an explanatory view illustrating the major pottion of the wire bonder of the prior art; FIG. 1B is a perspective view showing the disconnection detecting clamper; FIG. 1C is a view showing the normal bonding state; and FIG. 1D is a view showing the disconnected state.

FIG. 7 is a truth table;

FIGS. 8A to 8C are front elevations of an essential portion but show modifications of the present invention;

FIG. 9 is a side elevation showing another embodiment of the present invention.

DESCRIPTION OF THE PREFERRED EMBODIMENTS

The present invention will be described in detail in the following in connection with the embodiments thereof.

Figure 1A:
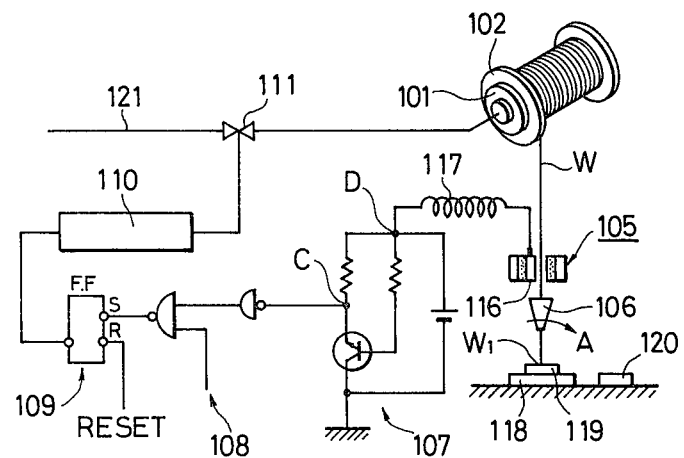
In FIGS. 1A to 1D schematically showing the wire bonder according to the prior art.
Figure 1B:
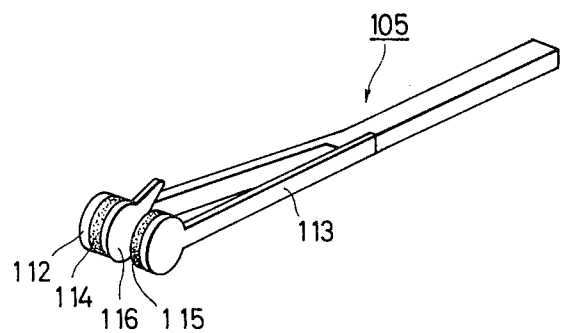
Figure 1C:
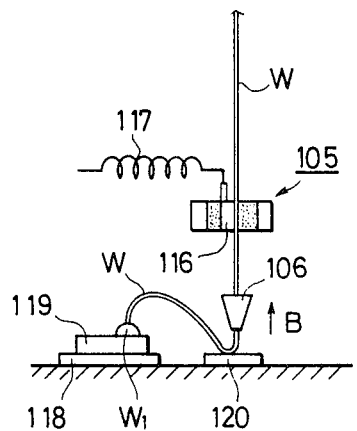
Figure 1D:
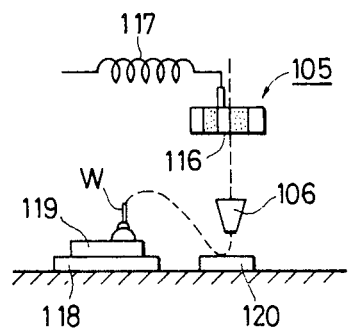
Figure 2:
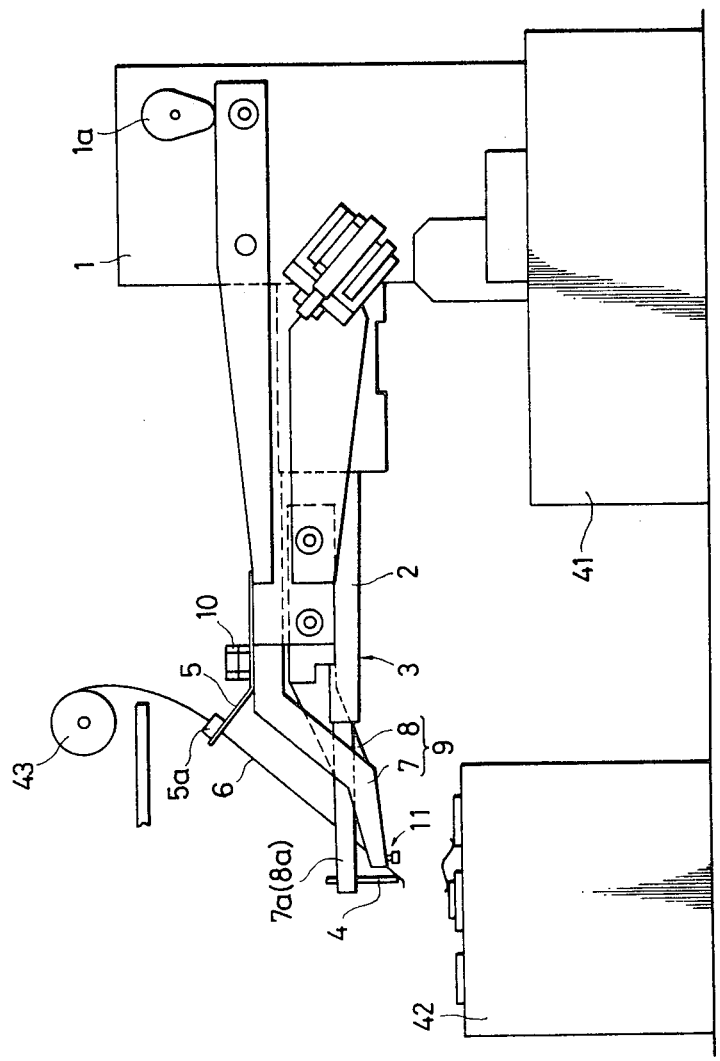
FIG. 2 is a side elevation showing a wire bonder according to the present invention.

FIG. 2 is a schematic side elevation showing an ultrasonic wire bonder according to one embodiment of the present invention. The ultrasonic wire bonder as shown is equipped with a bonding head 1 which is mounted on an XY table 41 and which has a bonding arm 3 hinged thereto in a vertically swingable manner.

Below a bonding tool wedge 4, on the other hand, there is disposed a sample table 42 on which a sample to be bonded with a bonding wire is placed in a suitably rotating manner.

Figures 3A, 3B:
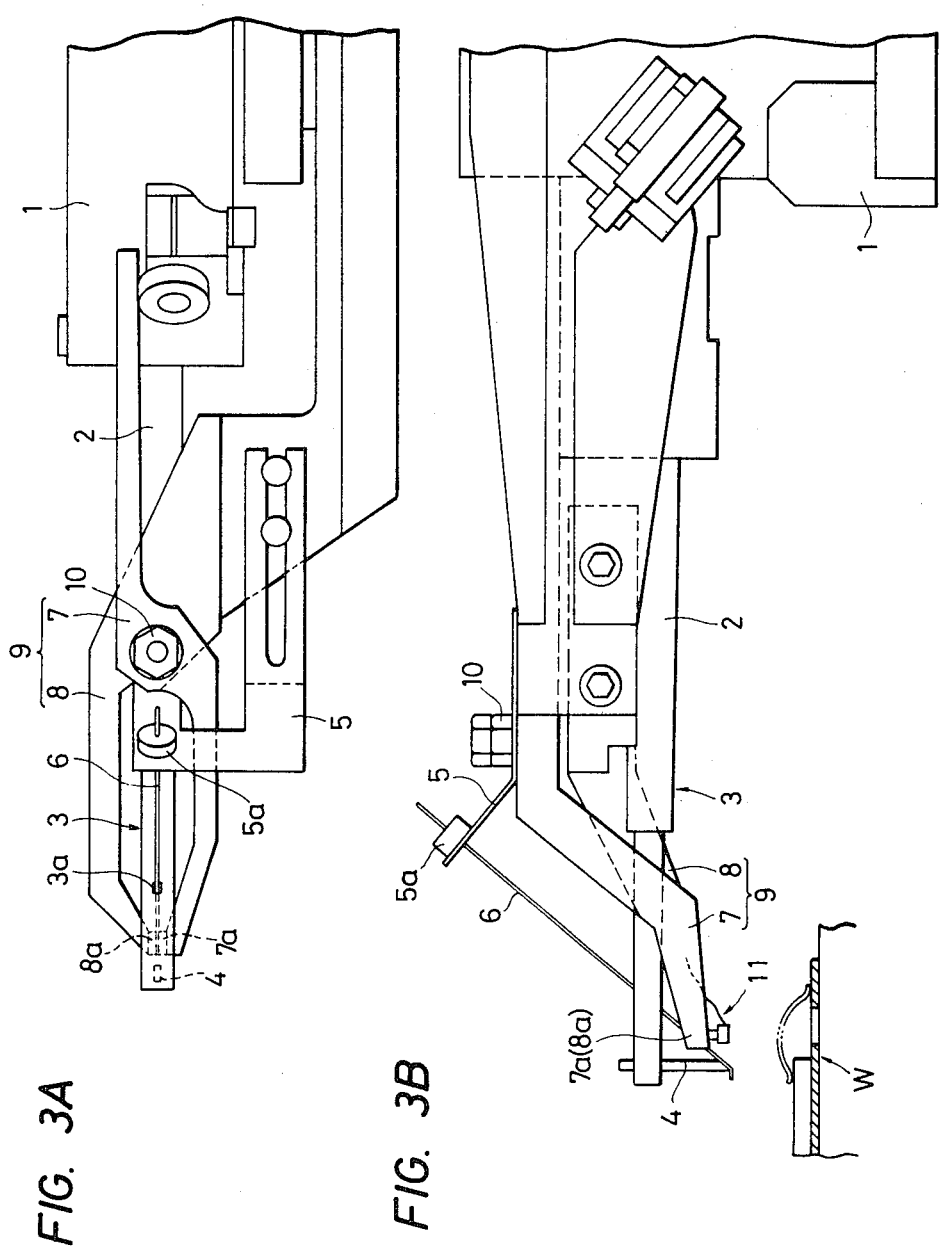
FIGS. 3A and 3B are a top plan view and a side elevation showing an essential portion of the wire bonder of the present invention, respectively.
Figure 4:
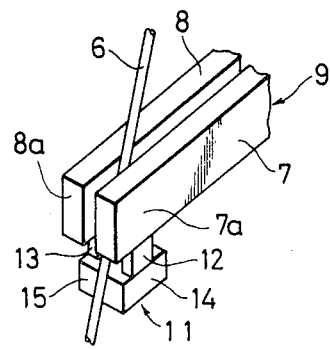
FIG. 4 is an enlarged perspective view showing clamper.

FIGS. 3A and 3B are enlarged top plan and side elevation showing an essential portion of the embodiment of FIG. 2, respectively. To the bonding head 1 mounted on the XY table, there is hinged in a vertically swingable manner the bonding arm 3 which is constructed mainly of an ultrasonic horn 2 such that the wedge borne on the leading end thereof can be moved up and down by the action of cam means 1a. Into the aforementioned wedge 4, there is introduced the leading end portion of a bonding wire 6 which is let out of a spool 43 through both a hole 3a formed in the bonding arm 3 and the leading ring 5a of a guide member 5 formed to protrude from the bonding head 1. In this instance, the bonding wire 6 is made of an aluminum wire, for example. Above the base end of the aforementioned bonding arm 3, there is arranged a clamper 9 which is constructed of a pair of intersecting clamping arms 7 and 8. These respective clamping arms 7 and 8 are so constructed that one 7 or both 7 and 8 of them can finely swing in a horizontal plane on a pivot pin 10. When solenoid means outside of the drawings is energized, those clamping tips 7a and 8a of the clamping arms 7 and 8, which are positioned to protrude below the aforementioned bonding arm 3, are finely swung toward each other so that they can clamp sideway that portion of the aforementioned wire 6, which exists between the clamping tips 7a and 8a.

Figure 5A:
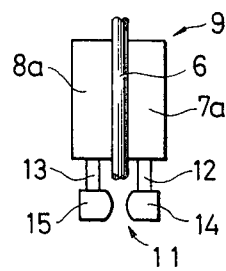
FIGS. 5A and 5B are views for explaining the operations of the clamper.
Figure 5B:
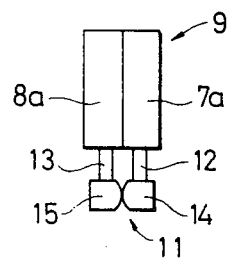
Figure 6:
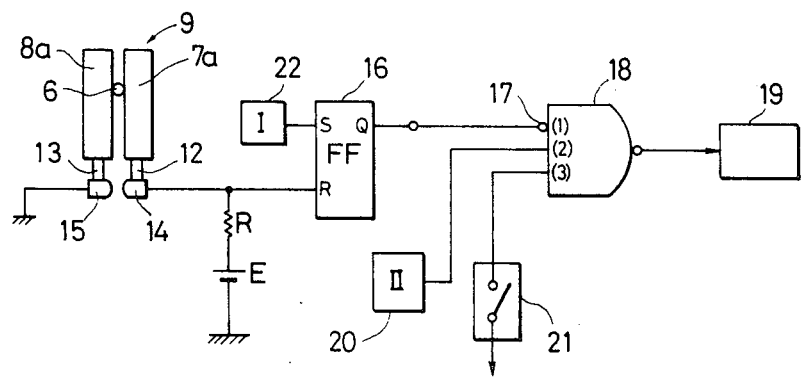
FIG. 6 is a circuit diagram.

To these clamping tips 7a and 8a, on the other hand, there is attached a gap detecting unit 11 which is made operative to measure and detect a spaced distance corresponding to the facing gap between the clamping tips. That gap detecting unit of the present embodiment is constructed of a pair of contacts 14 and 15 which are arranged below the respective clamping tips 7a and 8a through respective insulating members 12 and 13 such that they are insulated from the clamping tips 7a and 8a, respectively. Those respective contacts 14 and 15 are so constructed that they are spaced from each other when they clamp the wire 6, as better seen from FIG. 5A, but that they contact with each other, when no wire exists inbetween, as shown in FIG. 5B, thereby to have an electrically conductive relationship with each other. Moreover, those contacts 14 and 15 form together a portion of the disconnection detecting circuit, as shown by way of example in FIG. 6, by grounding the contact 15 to the earth and by partly feeding the other contact 14 with a voltage +E [V] from a power source E through a resistor R and partly connecting it with the reset terminal (R) of a flip-flop circuit (FF) 16. The set terminal (S) of this flip-flop circuit (FF) 16 is connected with a timing I signal source 22. Incidentally, the FF 16 has such a truth table as is illustrated in FIG. 7. As a result, the aforementioned timing I signal is held at a high level "H" while the wire bonder is in operation but temporarily becomes a low level "L" signal immediately before the clamping operation of the clamper 9. The output terminal (Q) of that flip-flop circuit (FF) 16 is connected through an inverter 17 with the input terminal (1) of a NAND circuit 18. This NAND circuit 18 has its output terminal connected with, an automatic stopping mechanism 19 of the wire bonder. When that NAND circuit 18 generates the "H" signal, the automatic stopping mechanism does not operate but maintains the wire bonder as it is at its operating state. When the "L" signal is generated, on the contrary, the automatic stopping mechanism 19 operates to stop the wire bonder. On the other hand, the input terminals (2) and (3) of that NAND circuit 18 are fed with a timing II signal and the signal of a detection switch 21. A timing II signal source 20 generates the "H" signal at a predetermined timing, as will be detailed hereinafter, whereas the detection switch 21 generates the "H" signal when it is intended to operate the disconnection detecting means according to the present invention. Incidentally, even if the wedge is to be abruptly stopped during the bonding operation, it is impossible from the mechanism inclusive to obviate a discrepancy between the input of the electric signal for the aforementioned stop and the stop of the wedge due to the inertia of the parts such as the bonding arm bearing the wedge, the bonding head for driving the same or the XY table. From this discrepancy, it is necessary to generate the "H" signal from the timing II signal source 20 in advance with a timing shift corresponding to the time lag which is required of the automatic stopping mechanism 19 so that the wire bonder may be stopped with a predetermined timing.

Next, the operations of the wire bonder having the construction thus far described will be described in the following. Immediately before the clamper 9 is about to clamp the wire 6 as the wire bonding step proceeds, the timing I signal source 22 temporarily feeds the "L" signal to the terminal (S) of the flip-flop circuit (FF) 16. On the other hand, the terminal (R) is fed with the "H" signal, because the contacts 14 and 15 are out of contact, so that the flip-flop circuit (FF) 16 generates the "H" signal. This is necessary as a preparatory operation for ensuring the disconnection detection to be conducted at the next timing. If the clamper 9 clamps the wire 6 at the next timing, the terminal (R) of the flip-flop circuit (FF) 16 is held at such a state as is fed with the voltage +E [V], i.e., the "H" signal because the contacts 14 and 15 are not in contact, as shown in FIG. 5(A). As a result, the output terminal (Q) of the flip-flop circuit (FF) 16 is left at the "H" level. As a result, the terminal (1) of the NAND circuit 18 is fed with the "L" signal through the inverter 17 so that the NAND circuit 18 generates the 3∂H" signal irrespective of the respective outputs of the timing II signal source 20 and the detection switch 21 thereby to continue the wire bonding operation without operating the automatic interruptor 19. In case the wire is disconnected, however, the clamper 9 cannot clamp the wire any more so that the contacts 14 and 15 are brought into contact until they are rendered electrically conductive, as shown in FIG. 5(B). As a result, the terminal of the resistor R at the side of the contacts 14 and 15 is grounded to the earth through the contacts 14 and 15 so that the terminal (R) of the flip-flop circuit (FF) 16 is also grounded and fed with the "L" signal. Since, at this time, the timing I signal has already been raised from the temporary "L" state immediately before the clamping operation to the "H" state, the output terminal (Q) of the flip-flop circuit (FF) 16 is at the "L" state. As a result, the terminal (1) of the NAND circuit 18 is fed through the inverter 17 with the "H" signal. In addition to this state, at this time, if the detection switch 21 for operating the disconnection detecting means according to the present invention is turned on and if the terminal (3) of the NAND circuit 18 is at the "H" state, the output of the NAND circuit 18 is at the "L" level when the timing II signal source 20 feeds the "H" signal to the terminal (2). As a result, the automatic stopping mechanism 19 is started to stop the wire bonder at the time when the wire bonder is returned to its start position after a predetermined time lag. In this instance, there may be provided a mechanism for simultaneously lighting an indication lamp. As a result, immediately after the wire disconnection is detected, the wire bonder is stopped so that the reset of the wire can be stood by at that state while preventing condemned articles from being produced. In this case, incidentally, if the detection switch 21 is held at its "OFF" state, the input to the input terminal (3) of the NAND circuit is at the "L" level. As a result, the output of the NAND circuit 18 is always at the "H" level so that the wire bonding operation is not interrupted unless the clamper 9 clamps the wire. This mode of operation is effective if it is used for testing the wire bonder.

In the wire bonder according to the embodiment thus far described, the detection of the existence or nonexistence of the wire being clamped, i.e., the disconnection of the wire is effected on the basis of the contacting state of the contacts 14 and 15 borne on the respective clamping tips 7a and 8a, i.e., the gap between the clamping tips 7a and 8a. Therefore, even if the aluminum wire formed with alumina acting as an insulating material is used as the bonding wire, the disconnection can be detected reliably and accurately independently of the conductivity, shape and mode of the wire thereby to prevent an erroneous detection and the reduction in working efficiency caused by the former.

Moreover, the present invention may have the aforementioned gap detecting unit 11 modified to have the constructions shown in FIGS. 8A to 8C. In the modification of FIG. 8A, contacts 14A and 15B are adhered to the clamping arms 7a and 8a, respectively, by means of insulating adhesives 12A and 13A such that their facing sides are made to protrude inwardly from the inner sides of the clamping arms 7a and 8a. According to this construction, the contacts 14A and 15A don't contact with each other if the wire 6 maintains its predetermined diameter $D_1$. However, when the wire had a smaller diameter of $(D_1-t_1)$ than the predetermined value even if it is clamped, the detection is conducted deeming the diameter reduction as the disconnection so that the wire can be prevented from being bonded with degraded reliability. In the modification shown in FIG. 8B, on the other hand, pressure sensors 23 and 24 such as piezoelectric elements are attached to the respective facing sides of insulating members 12B and 13B, which in turn are attached to the lower ends of the clamping tips 7a and 8a, so that whether or not the wire is clamped can be detected in terms of the magnitude of the clamping force between the clamping tips 7a and 8a by the coactions of the pressure sensors 23 and 24. Even if the wire is clamped, moreover, the detection can be conducted deeming it as the disconnection that the wire diameter is smaller than the predetermined value. In a further modification shown in FIG. 8C, a light emitting element 26 such as a light emitting diode is attached to one clamping tip 7a by means of a bracket 25 whereas a light receiving element 28 such as a photo-transistor is attached to the other clamping tip 8a by means of a bracket 27. As a result, when the clamping tips 7a and 8a fail to clamp the wire, the light emitted from the light emitting element 26 is received by the light receiving element 28 so that a detection signal can be generated as an electric signal by the light receiving element 28.

Although the foregoing description is directed to the embodiments in which the present invention is applied to the ultrasonic wire bonder, it goes without saying that the present invention can be applied to a wire bonder of thermo compression neil head wire bonding type. In this thermo compression neil head wire bonding hot wire bonder, specifically, although no insulating oxide film is formed on the wire surface because a gold wire is used, a stain or the like on the wire surface may be transferred to the clamping tip or tips thereby to deteriorate the contact conductivity between the clamper and the wire. Even in this case, the detection of the wire disconnection can be reliably effected according to the present invention. One example is shown in FIG. 9, in which the wire 6 is inserted in a bonding tool capillary 31 fixedly borne on the leading end of a bonding arm 30 hinged in a vertically swingable manner to the bonding head 1 but is clamped above that bonding arm 30 by means of a clamper 34 composed of a pair of clamping arms 32 and 33. Moreover, contacts 35 (and 36) are borne on the leading end of that clamper 34, i.e., on clamping tips 33a (and 32a), respectively, so that the disconnection of the wire 6 may be detected similarly to the foregoing respective embodiments.

In each of the aforementioned embodiments, incidentally, the gap of the clamper may be detected not at the clamping tips but at that portion of the base end of the clamper, in which the lever ratio is high. Then, the reference size for the detection can be enlarged in accordance with that lever ratio so that the detection accuracy can be accordingly improved. At the portion of the base end of the clamper, specifically, there may be disposed the gap detecting unit for detecting the facing gap between the clamping arms 7 and 8 shown in FIGS. 5A and 5B and in FIGS. 8A, 8B and 8C.

Figure 10:
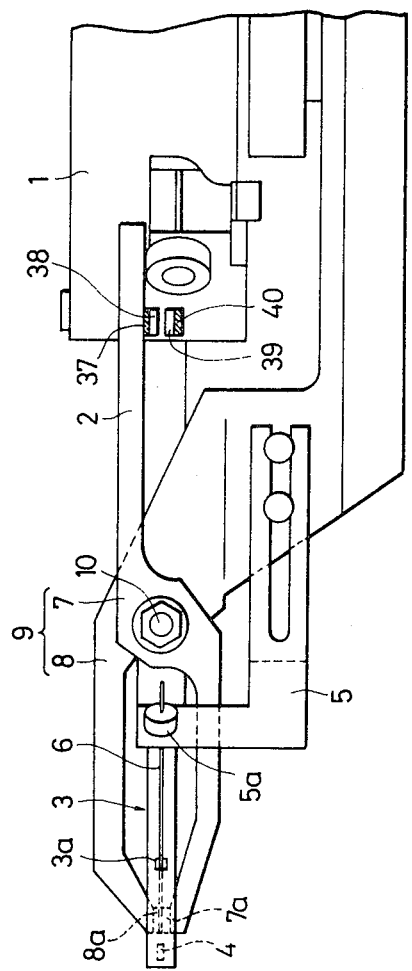
FIG. 10 is a top plan view showing an essential portion of still another embodiment.

In case, on the other hand, the disconnection detection is to be conducted in a portion other than the clamping tips 7a, 8a, 32a and 33a, the direct detection of the facing gap between the clamping 7 and 8 may be replaced by the physical quantity which has a predetermined relationship with that facing gap. One example of this detection is shown in FIG. 10. As the detecting unit for detecting a distance which has a correlation with the facing gap between the clamping arms 7 and 8 while exemplifying the aforementioned physical quantity, there can be conceived a pair of conductive contacts 38 and 39 which are secured, respectively, through insulating members 40 and 37 to a stationary position on the bohding head 1 and to the clamping arm 7 while being electrically insulated from the bonding head 1 and the clamping arm 7. Those respective contacts 38 and 39 are so constructed that they are spaced from each other, as shown in FIG. 10, when the wire is clamped by the clamping arms 7 and 8, but are brought into contact to have an electrically conductive relationship when the wire does not exists between the clamping arms 7 and 8. Moreover, those contacts 38 and 39 constitute together the circuit shown in FIG. 6 in a manner to correspond to one of the contacts 15 and 14 of FIG. 6 so that they are enabled to detect the disconnection of the wire reliably and accurately by the operations and actions thus far described in detail while preventing any erroneous detection and accordingly the reduction in the working efficiency caused by the former. Here, the detecting unit thus far described may be constructed to include the pressure sensors shown in FIG. 8B On the other hand, the quantity, which is detected as a physical one correlating to the facing gap between the afore-mentioned clamping arms 7 and 8, is not limited to the afore-mentioned distance between either of the clamping arms and an arbitrary stationary point. By connecting one point of the clamping arm 7 and one point on the bonding head 1 by means of an elastic member such as a spring, for example, the difference in the elongation of the elastic member such as the spring between when the clamping arms 7 and 8 do clamp and not the wire can be detected in terms of the difference in the modulus of elasticity, i.e., the physical quantity correlating with the aforementioned facing gap, whereby the disconnection, if any, can be detected. Moreover, it is conceivable to secure a reflecting mirror to the portion, to which the insulating member 37 of FIG. 10 is attached, and to arrange a light emitting element and a light receiving element so suitably that the light emitted from the light emitting element may be incident upon the light receiving element through that reflecting mirror only when the wire is clamped by the clamping arms 7 and 8. In this modification, the angle $\theta$ between the surface of the reflecting mirror and the incident light is deemed as the physical quantity correlating with the aforementioned facing gap. Thus, whether or not the wire is clamped can be grasped as the existence or nonexistence of the incidence of light upon the light receiving element, whereby the disconnection can be detected. A light emitting diode and a photo-transistor can be used as the light emitting element and the light receiving element, respectively. In this modification, the displacement $\Delta\theta$ of the incident light due to the change in the reflecting mirror is increased to the displacement $2\theta\Delta$ of the reflected light so that the detection can be facilitated.

By knowing the change in the physical quantity correlating with the aforementioned facing gap in that way, the disconnection can be detected reliably and accurately to prevent any erroneous detection thereby to improve the working efficiency more than the prior art. In this modification, moreover, the detecting accuracy can be improved because it is possible to enjoy a larger degree of freedom in setting the ratio of a quantity to be detected to some physical quantities, thus providing reference to the detection.

As has been described hereinbefore, according to the wire bonder of the present invention, the facing gap between the paired clamping tips or the physical quantity correlating therewith is detected to detect whether the wire is clamped or not. Irrespective of the material of the wire and the propriety of the contact state between the wire and the clamper, therefore, the existence or nonexistence of the wire clamped can be reliably detected to detect the disconnection of the wire, whereby any erroneous detection can be prevented to prevent any condemned article in advance from being produced and to achieve the improvement in the working efficiency of the wire bonder.

What is claimed is:

1. A wire bonder comprising:
   a clamper for clamping a bonding wire in the vicinity of where the bonding wire is engaged by a bonding tool, said clamper having a pair of clamping arms for clamping said bonding wire therebetween during a clamping operation;
   a bonding wire disconnection detecting menas for detecting a disconnection of said bonding wire from said clamper during said clamping operation, said disconnection detecting means including a pair of detecting units fixed on said pair of clamping arms, respectively, said pair of detecting units being spaced apart from each other with a predetermined gap when said bonding wire exists between said pair of clamping arms during said clamping operation, while said pair of detecting units come closer to each other than said predetermined gap when no said bonding wire exists between said clamping arms; and
   a detecting circuit for deriving an electrical signal from said pair of detecting units in response to the fact that said pair of detecting units have come closer to each other than said predetermined gap during said clamping operation.

2. A wire bonder as set forth in claim 1, wherein said pair of detecting units are composed of a pair of electrically conductive elements, and said pair of electrically conductive elements are contacted with each other when no bonding wire exists between said pair of clamping arms during said clamping operation, so as to form a closed circuit said detecting circuit.

3. A wire bonder as set forth in claim 1, wherein at least one of said pair of detecting units is composed of a pressure sensor element fixed on at least one of said pair of clamping arms, and said pressure sensor element generates an electrical signal when said pair of detecting units come closer to each other than said predetermined gap.

4. A wire bonder as set forth in claim 1, wherein one of said pair of detecting units is composed of a light emitting element, while the other of said pair of detecting units is composed of a light receiving element for generating an electrical signal upon reception of the light of said light emitting element when said light emitting element and said light receiving element come closer to each other than said predetermined gap during said clamping operation.

5. A wire bonder as set forth in claim 1, wherein said detecting units are positioned on tips of respective clamping arms so as to be spaced apart by a distance that is less than the distance between said tips, whereby a disconnection can be indicated even if a wire is clamped, thereby preventing bonding of a wire that has a diameter less than that corresponding to said predetermined gap.

6. A wire bonder as set forth in claim 1, wherein said detection circuit, during a bonding operation, is connected to a control means for automatically stopping the wire bonder in a manner such that said detection circuit is inoperative for actuating said control means until commencement of the clamping operation of said clamping arms.

* * * * *